(12) United States Patent
Peng et al.

(10) Patent No.: US 8,828,841 B2
(45) Date of Patent: Sep. 9, 2014

(54) SEMICONDUCTOR DEVICE AND METHOD OF MANUFACTURE

(71) Applicant: Taiwan Semiconductor Manufacturing Company, Ltd., Hsin-Chu (TW)

(72) Inventors: Chih-Tang Peng, Zhubei (TW); Bing-Hung Chen, San-Xia Town (TW); Tze-Liang Lee, Hsin-Chu (TW); Hao-Ming Lien, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/153,854

(22) Filed: Jan. 13, 2014

(65) Prior Publication Data

US 2014/0127879 A1    May 8, 2014

Related U.S. Application Data

(63) Continuation of application No. 13/711,323, filed on Dec. 11, 2012, now Pat. No. 8,629,508, which is a continuation of application No. 13/189,204, filed on Jul. 22, 2011, now Pat. No. 8,329,552.

(51) Int. Cl.
*H01L 21/44* (2006.01)
*H01L 21/768* (2006.01)
*H01L 21/285* (2006.01)

(52) U.S. Cl.
CPC .... *H01L 21/76843* (2013.01); *H01L 21/76876* (2013.01); *H01L 21/76877* (2013.01); *H01L 21/28562* (2013.01)
USPC ........... 438/424; 438/623; 438/624; 438/692; 438/738; 257/E21.241; 257/E21.244; 257/E21.515; 257/E21.529

(58) Field of Classification Search
CPC .................. H01L 21/76843; H01L 21/76876; H01L 21/76877; H01L 21/28566
USPC .......................... 438/424, 623, 624, 692, 738; 257/E21.241, 244, 515, 529
See application file for complete search history.

(56) References Cited

U.S. PATENT DOCUMENTS

| | | | |
|---|---|---|---|
| 5,525,550 A | 6/1996 | Kato | |
| 5,643,407 A | 7/1997 | Chang | |
| 5,872,043 A | 2/1999 | Chen | |
| 5,883,006 A | 3/1999 | Iba | |
| 5,908,672 A | 6/1999 | Ryu et al. | |
| 5,935,646 A | 8/1999 | Raman et al. | |
| 6,025,279 A | 2/2000 | Chiang et al. | |
| 6,107,143 A | 8/2000 | Park et al. | |
| 7,214,608 B2 | 5/2007 | Angyal et al. | |
| 7,842,518 B2 | 11/2010 | Miyajima | |
| 7,858,294 B2 | 12/2010 | Hacker et al. | |
| 8,329,552 B1 * | 12/2012 | Peng et al. | 438/424 |
| 8,629,508 B2 * | 1/2014 | Peng et al. | 257/377 |
| 2008/0171438 A1 | 7/2008 | Sinha et al. | |
| 2008/0182382 A1 | 7/2008 | Ingle et al. | |
| 2009/0170280 A1 | 7/2009 | Park | |

* cited by examiner

*Primary Examiner* — Michael Lebentritt
(74) *Attorney, Agent, or Firm* — Slater and Matsil, L.L.P.

(57) ABSTRACT

A system and method for forming an isolation trench is provided. An embodiment comprises forming a trench and then lining the trench with a dielectric liner. Prior to etching the dielectric liner, an outgassing process is utilized to remove any residual precursor material that may be left over from the deposition of the dielectric liner. After the outgassing process, the dielectric liner may be etched, and the trench may be filled with a dielectric material.

20 Claims, 5 Drawing Sheets

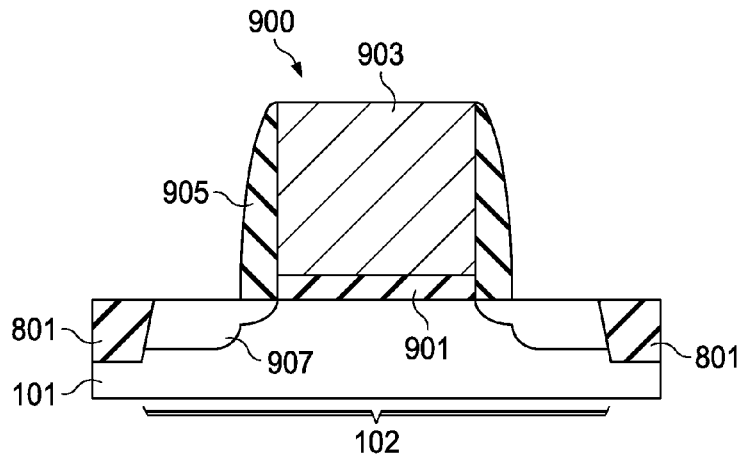
FIG. 9
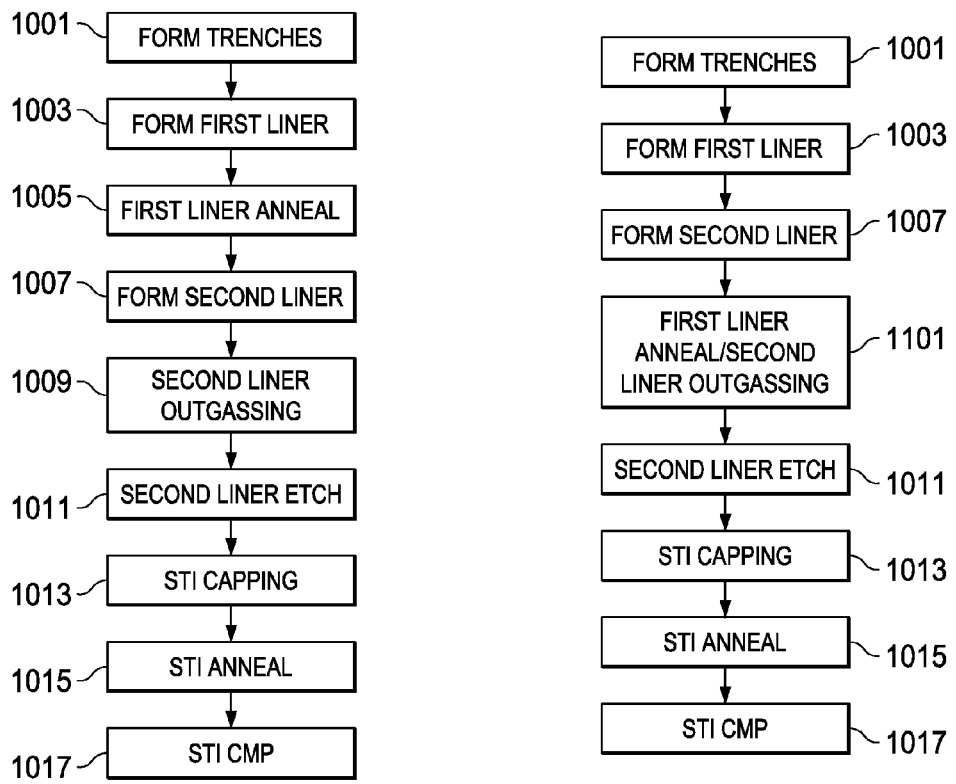
FIG. 10
FIG. 11

SEMICONDUCTOR DEVICE AND METHOD OF MANUFACTURE

This application is a continuation of U.S. patent application Ser. No. 13/711,323, filed on Dec. 11, 2012, entitled "Semiconductor Device and Method of Manufacture," which is a continuation of U.S. patent application Ser. No. 13/189,204, filed on Jul. 22, 2011, entitled "Semiconductor Device and Method of Manufacture," which applications are hereby incorporated herein by reference in their entirety.

BACKGROUND

Generally, a shallow trench isolation (STI) may be formed by initially forming a trench within a substrate. The trench may then be lined with, e.g., an oxide liner formed by chemical vapor deposition (CVD). The oxide liner may then be etched in order to reduce the STI aspect ratio and widen the STI opening, which facilitate a subsequent gap fill process. Once the oxide liner is at the desired thickness and profile, the trench may be filled and overfilled with dielectric material before being planarized such that the dielectric material is planar with the substrate, thereby forming the STI.

However, as semiconductor devices have gotten smaller and smaller in the never ending race to miniaturize, problems have arisen with this process as semiconductor devices have shrunk to the twenty-eight nanometer node and smaller. In particular, as the trenches have been miniaturized to meet the twenty-eight nanometer node, a gel like material has begun to be formed during the manufacturing of the STIs, creating defects in some of the STIs that are being manufactured. Additionally, the defects caused by the gel like material are persistent and are not removed by an aging process.

In an effort to fix this problem of gelation, various treatments have been attempted to treat the gel like material. For example, a sulfuric peroxide mixture (SPM) has been applied to the gel like material in an attempt to react and remove the gel like material. Additionally, in an attempt to improve over the simple SPM process, an oxygen ashing process has also been utilized in conjunction with the SPM process. However, neither of these processes has been sufficient to remove the defects. Additionally, both of these processes only treat the gel like material after it has been formed, and do not address or treat the underlying causes of the creation of the gel like material.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 illustrates the formation of a transition between two isolation trenches in accordance with an embodiment; and FIGS. 10-11 illustrate process flows for forming the isolation trenches in accordance with embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a shallow trench isolation. The invention may also be applied, however, to other isolation structures.

Figure 1:
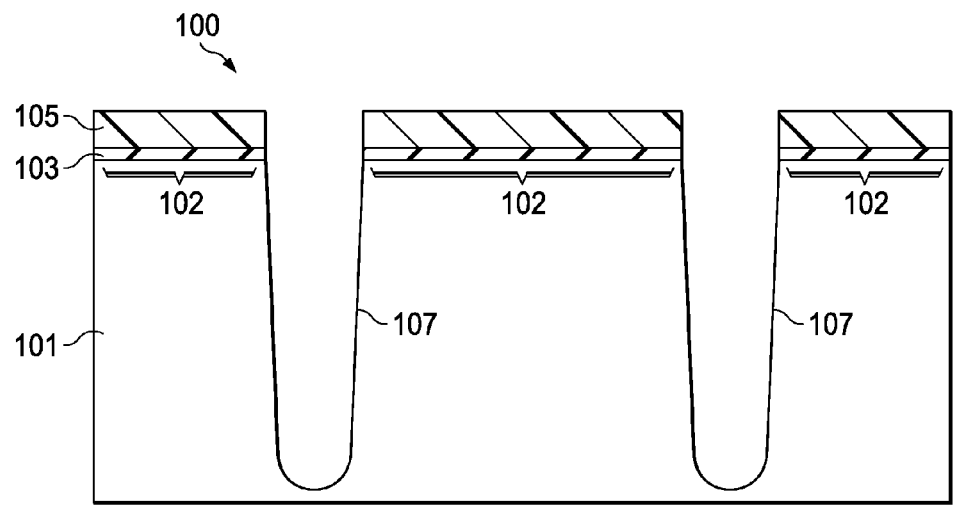
FIG. 1 illustrates the formation of trenches within a substrate in accordance with an embodiment.

With reference now to FIG. 1, there is shown a semiconductor device 100 with a substrate 101, active areas 102, a buffer layer 103, and a masking layer 105 used to form trenches 107 into the substrate 101. The substrate 101 may comprise bulk silicon, doped or undoped, or an active layer of a silicon on insulator (SOI) substrate. Generally, an SOI substrate comprises a layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

The active areas 102 are areas of the substrate 101 adjacent to the top surface of the substrate 101 into which dopants may be implanted in order to make the active areas 102 conductive. Each of the active areas 102 may be separated from each other by the trenches 107. The active areas 102 will be used to form active devices such as transistors, resistors, etc. (described below in greater detail with respect to FIG. 8).

The buffer layer 103 may be used to provide a buffer between the substrate 101 and the masking layer 105. The buffer layer 103 may be a buffering material, such as an oxide like silicon oxide, although any suitable buffering material may be utilized. The buffer layer 103 may be formed through a thermal oxidation of the substrate 101 although any suitable process for forming the buffer layer 103 may be utilized. The buffer layer 103 may be formed to a thickness of between about 50 Å and about 200 Å, such as about 100 Å.

The masking layer 105 may be formed and patterned over the buffer layer 103 and the substrate 101 to protect the active areas 102 while exposing portions of the substrate 101 to assist in the formation of the trenches 107. The masking layer 105 may be formed by depositing a hardmask layer comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may alternatively be utilized. Once formed, the hardmask layer is patterned through a suitable photolithographic process to expose those portions of the substrate 101 as illustrated in FIG. 1.

As one of skill in the art will recognize, however, the processes and materials described above to form the masking layer 105 are not the only method that may be used to protect the active areas 102 while exposing portions of the substrate 101 for the formation of the trenches 107. Any suitable process, such as a patterned and developed photoresist, may alternatively be utilized to protect the active areas 102 of the substrate 101 while exposing portions of the substrate 101 to be removed to form the trenches 107. All such methods are fully intended to be included in the scope of the present invention.

Once the masking layer 105 has been formed and patterned, the trenches 107 may be formed in the substrate 101. The exposed substrate 101 may be removed through a suitable process such as reactive ion etching (RIE) in order to form the trenches 107 in the substrate 101, although other suitable processes may alternatively be used. The trenches 107 may be formed to be between about 2,400 Å and about 5,000 Å in depth from the surface of the substrate 101, such as about 3,000 Å, and may have an aspect ratio of between about 1 and about 10, such as about 6.

Figure 2:
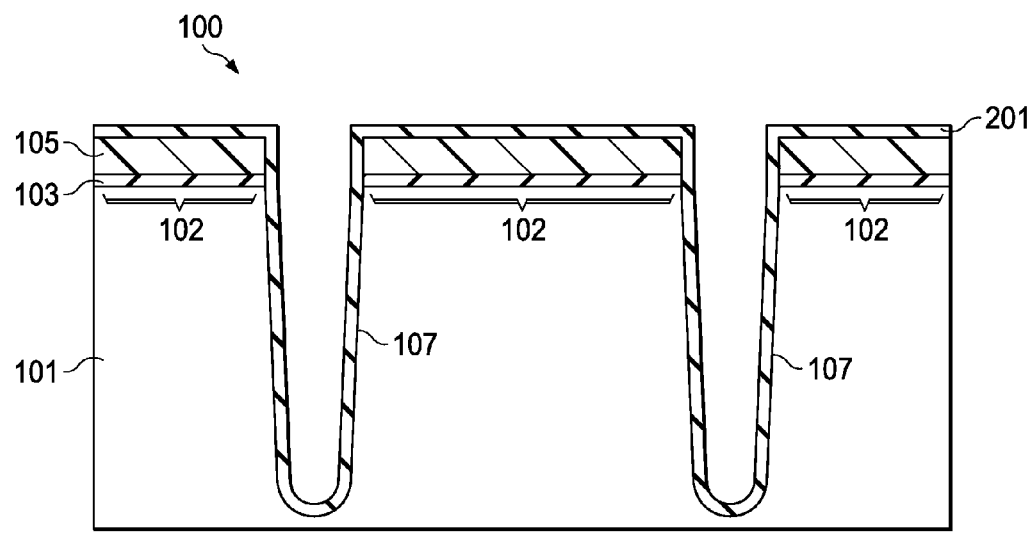
FIG. 2 illustrates the formation of a first liner within the trenches in accordance with an embodiment.

FIG. 2 illustrates the formation of a first liner 201 along the sidewalls and bottoms of the trenches 107. The first liner 201 may be a dielectric such as silicon oxide formed by an in-situ steam generation (ISSG) process. In the ISSG process hydrogen, oxygen, and argon are introduced into a chamber heated to a temperature of between about 900° C. and 1100° C., such as about 1050° C., and held at a pressure of between about 5 torr to about 15 torr. The hydrogen may be introduced at a rate of about 0.1 liters per minute to about 2.0 liters per minute, the oxygen may be introduced at a rate of between about 3 liters per minute to about 10 liters per minute, and the argon may be introduced at a rate of less than 10 liters per minute. The hydrogen and oxygen combine to form steam, which may then oxidize the exposed substrate 101 in the trenches 107 and form the first liner 201 to a thickness of between about 15 Å and about 100 Å, such as about 40 Å.

After the first liner 201 has been formed, the first liner 201 may be treated. In an embodiment the first liner 201 may be treated using a thermal anneal. The thermal anneal may heat the first liner 201 to a temperature of between about 900° C. and 1100° C., such as about 1050° C., and the anneal may be held for between about 15 minutes and about 90 minutes, such as about 30 minutes. However, other suitable anneals, such as a rapid thermal anneal, may alternatively be utilized.

Figure 3:
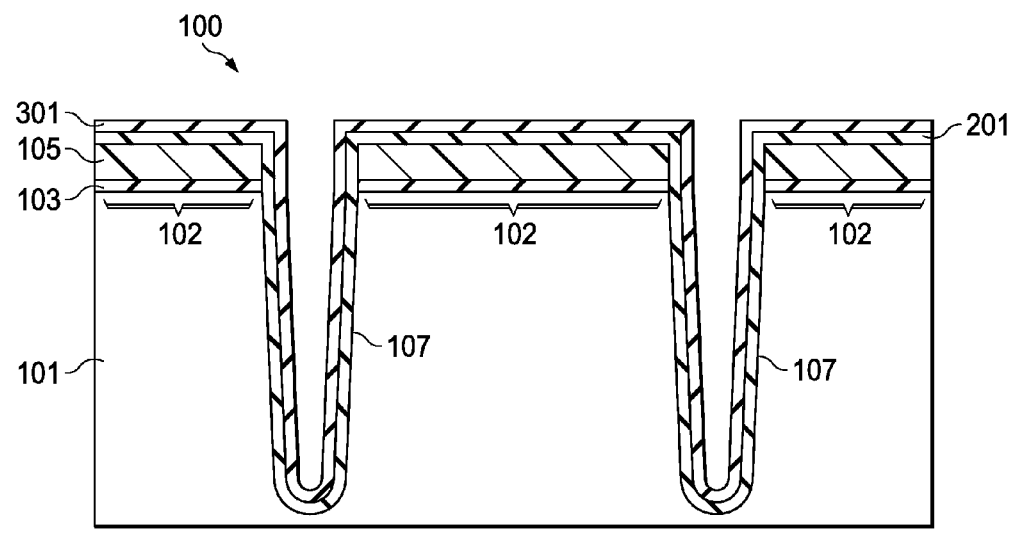
FIG. 3 illustrates the formation of a second liner within the trenches in accordance with an embodiment.

FIG. 3 illustrates the formation of a second liner 301 over the first liner 201. The second liner 301 may be a high aspect ratio process (HARP) liner, which is especially designed for openings (such as the trenches 107) with high aspect ratios of greater than 8. The second liner 301 may be, e.g., an oxide liner formed of silicon oxide. The oxide may be deposited using, e.g., CVD techniques using tetra-ethyl-ortho-silicate (TEOS) and oxygen (ozone) as precursors. In an embodiment the TEOS may be introduced at a flow rate of between about 500 mgm and about 6000 mgm, such as about 1000 mgm, while the oxygen may be introduced at a flow rate of between about 3000 sccm and about 30000 sccm, such as about 25000 sccm. The second liner 301 may be formed to a thickness of between about 150 Å and about 400 Å, such as about 220 Å.

However, while the TEOS and oxygen precursors may be utilized to from the silicon oxide for the first liner 201 and then evacuated from the process chamber, TEOS may remain behind. In particular, unreacted residual TEOS precursor material may remain within the second liner 301 after the formation process has been completed and the precursors removed. This unreacted residual TEOS precursor material may then be present to react with subsequent process steps in undesired reactions.

For example, when an etching process utilizing hydrogen fluoride (HF) and ammonia ($NH_3$) is utilized on the second liner 301, residual TEOS precursor material remaining within the second liner 301 may undergo hydrolysis reactions such as the chemical reactions illustrated in Equations 1-4 below.

  Eq. 1

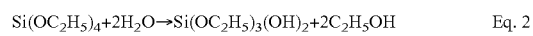  Eq. 2

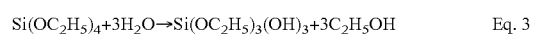  Eq. 3

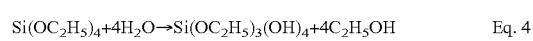  Eq. 4

Additionally, the TEOS may also undergo a series of condensation reactions such as the chemical reactions illustrated in Equations 5-6 below.

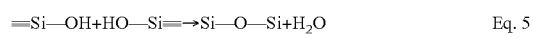  Eq. 5

  Eq. 6

It is believed that these hydrolysis and condensation reactions of TEOS with other chemicals in an acidic environment (such as an environment created by HF and $NH_3$ etchants), or in a basic environment with salts present, generate a gel like material that can cause defects within the semiconductor device 100.

Figure 4:
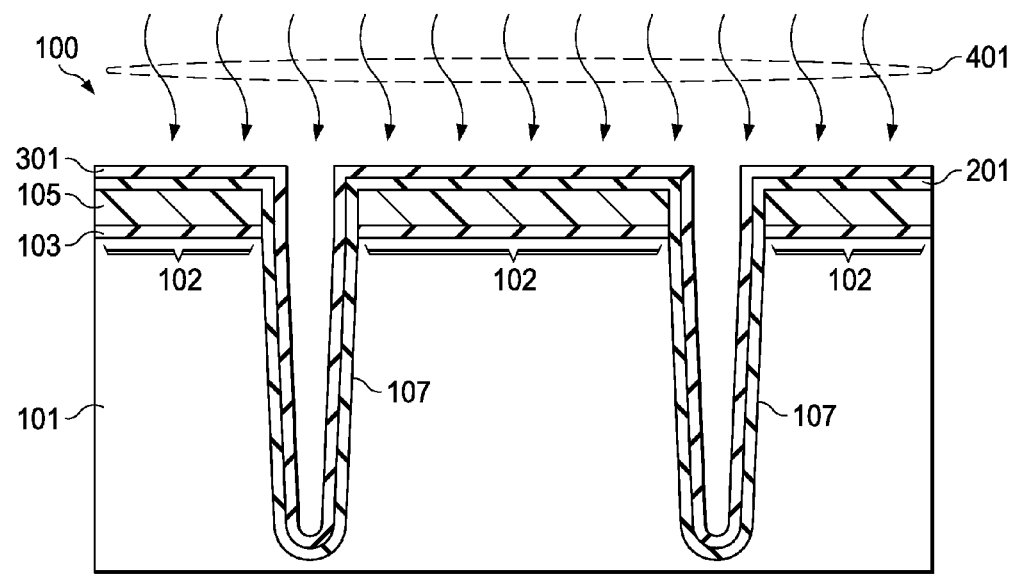
FIG. 4 illustrates an outgassing process performed on the second liner in accordance with an embodiment.

FIG. 4 illustrates an outgassing process 401 or treatment that may be used after the formation of the second liner 301 has been halted in order to remove any remaining precursors that may be located within the second liner 301 and help to prevent or reduce the above reactions from forming the gel like material. These precursors could be either the TEOS precursor, the oxygen precursor, or any other precursor that may remain within the second liner 301 and which may cause undesired reactions during subsequent process steps. In an embodiment, the outgassing process 401 may be, e.g., a rapid thermal anneal (RTA) which may heat the second liner 301 to between about 800° C. and about 1100° C., such as about 1050° C. for a period of between about 10 seconds and about 10 minutes, such as about 30 seconds, and which may use nitrogen or other suitable ambient environment.

However, as one of ordinary skill in the art will recognize, the RTA described above is only one process that may be utilized to perform the outgassing process 401. For example, a dry anneal using nitrogen (or other suitable ambient environment) may also be performed in which the second liner 301 is annealed at a temperature of between about 800° C. and about 1100° C., such as about 1050° C. for a time period of between about 15 minutes and about 120 minutes such as about 30 minutes. Other outgassing processes may cure the second liner 301 utilizing UV radiation for between about 10 seconds and about 10 minutes seconds or more treat the second liner 301 with a plasma treatment utilizing a plasma such as argon, nitrogen, helium, or the like. In yet another embodiment, a wet clean process using an etchant such as hot $H_2SO_4$ may be also utilized to outgass any remaining precursors from the second liner 301. These and any other suitable outgassing process may be utilized to remove residual precursor materials from the second liner 301, and all of these alternatives are fully intended to be included within the scope of the embodiments.

Figure 5:
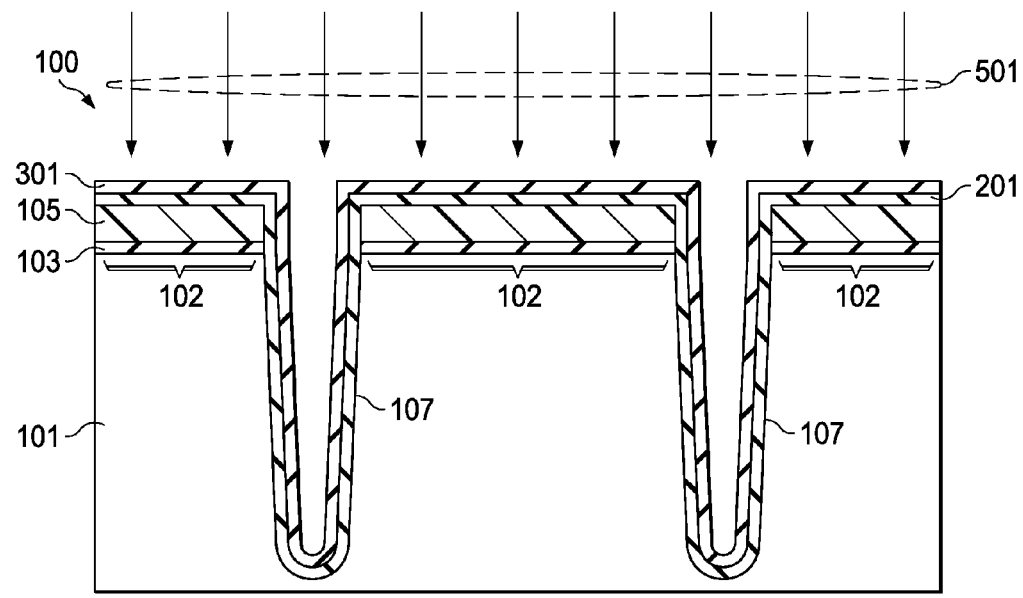
FIG. 5 illustrates an etching process performed on the second liner in accordance with an embodiment.

FIG. 5 illustrates an etching process 501 which may be used to treat the second liner 301 and also reduce the thickness of the second liner 301. In an embodiment the etching process 501 may be a CERTAS® etch, which introduces hydrogen fluoride (HF) and ammonia ($NH_3$) as etchants to the second liner 301. The HF and $NH_3$ may react with each other and with the oxide present in the second liner 301 to produce $(NH_4)_2SiF_6$ on a surface of the second liner 301. However, because the precursor materials from the formation of the second liner 301 have been removed during the outgassing process 401 (described above with respect to FIG. 4), these precursor materials (e.g., TEOS) are not available to react in the environment created by the HF and $NH_3$. As such, the reactants that form the gel like material and defects caused by the gel like material are simply not present, and no gel like material is formed.

Additionally, as the $(NH_4)_2SiF_6$ is formed on the exposed surface of the second liner 301, the $(NH_4)_2SiF_6$ will itself act as a diffusion barrier layer that will prevent the further diffusion of HF and $NH_3$ into the second liner 301. As such, the CERTAS® etch is effectively self-limiting, as the formation of $(NH_4)_2SiF_6$ will prevent further formation of $(NH_4)_2SiF_6$ at a deeper depth within the second liner 301. The precise depth to which the $(NH_4)_2SiF_6$ will form may be adjusted based on process conditions.

For example, in an embodiment the CERTAS® process conditions may be set so as to react between about 15 Å and about 150 Å, such as about 50 Å of the second liner 301 from an oxide to $(NH_4)_2SiF_6$. This desired depth may be obtained by controlling the temperature, pressure, and flow rates of the etchants within the CERTAS® process. For example, the etching process 501 may be performed at a temperature of between about 20° C. and about 60° C., such as about 30° C., while the pressure may be held between about 10 mTorr and about 100 mTorr, such as about 20 mTorr. Additionally, the flow rate of HF may be between about 10 sccm and about 100 sccm, such as about 20 sccm, and the flow rate of $NH_3$ may be between about 10 sccm and about 100 sccm, such as about 20 sccm. Other diluents, such as argon, xenon, helium, or other nonreactive gases, may additionally be utilized.

Once the reaction has effectively self-terminated (e.g., at a distance of 50 Å from the surface of the second liner 301), the second liner 301 (along with the substrate 101) may be heated using an annealing process in order to remove the $(NH_4)_2SiF_6$, thereby reducing the thickness of the second liner 301 by the thickness of the $(NH_4)_2SiF_6$ and also exposing a remaining portion of the second liner 301 for further processing. The heat may cause the $(NH_4)_2SiF_6$ to thermally decompose to $N_2$, $H_2O$, $SiF_4$, and $NH_3$, all of which may be vapor and may be removed from the surface of the second liner 301 by the annealing process. In an embodiment of the annealing process the second liner 301 may be heated to a temperature of between about 80° C. to about 200° C., such as about 100° C. for between about 60 seconds to about 180 seconds to remove the $(NH_4)_2SiF_6$ from the surface of the second liner 301.

After the $(NH_4)_2SiF_6$ has been removed, the second liner 301 is again exposed and may be further processed. In an embodiment a second etching process, such as a second CERTAS® etch similar to the first CERTAS® etch described above, may be performed to controllably reduce the thickness of the second liner 301 even further, such as reducing the second liner 301 by another 50 Å to have a second liner 301 thickness of between about 15 Å and about 150 Å, such as about 120 Å. However, as one of ordinary skill in the art will recognize, the precise type of etching process, the number of iterations of the CERTAS® process (in an embodiment in which the etching process 501 is a CERTAS® etch), the process parameters for the etching process, and the precise thickness of the second liner 301 as described above is intended to be illustrative only, as any number of iterations and any desired thickness of the second liner 301 may alternatively be utilized.

Figure 6:
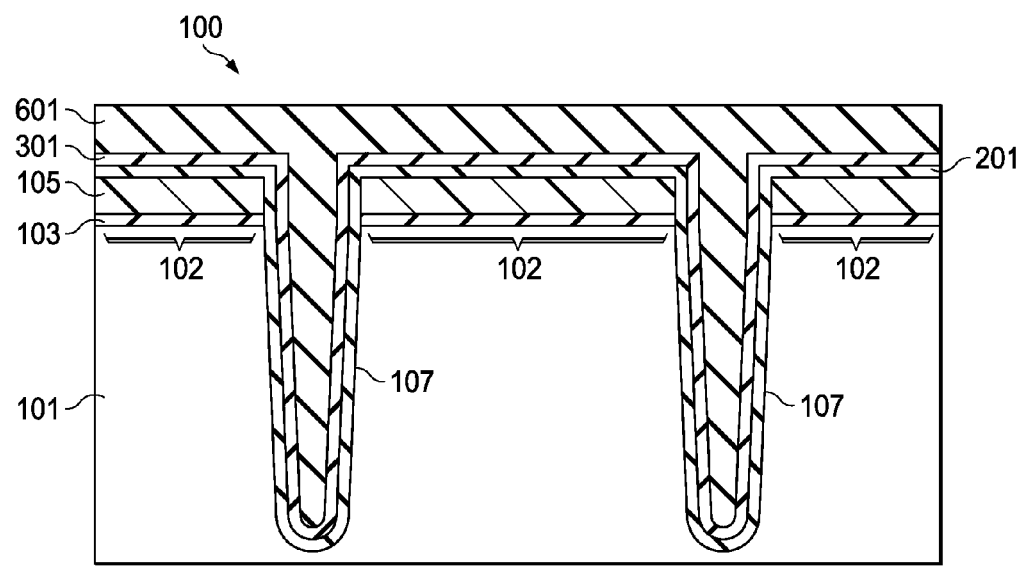
FIG. 6 illustrates a filling of the trenches with a dielectric material in accordance with an embodiment.

FIG. 6 illustrates the filling of the trenches 107 over the second liner 301 with a dielectric material 601. In an embodiment the dielectric material 601 may be an oxide material, a high-density plasma (HDP) oxide, high density undoped silicate glass (HTUSG), combinations of these, or the like. The dielectric material 601 may be formed using either a chemical vapor deposition (CVD) method, such as the HARP process, a high density plasma CVD method, atmospheric pressure CVD (APCVD), plasma enhanced CVD (PECVD), or other suitable method of formation as is known in the art. The trenches 107 may be filled by overfilling the trenches 107 and the masking layer 105 with the dielectric material 601. The dielectric material 601 may be formed to a thickness of between about 4000 Å and about 8000 Å, such as about 6600 Å, over the surface of the second liner 301.

Figure 7:
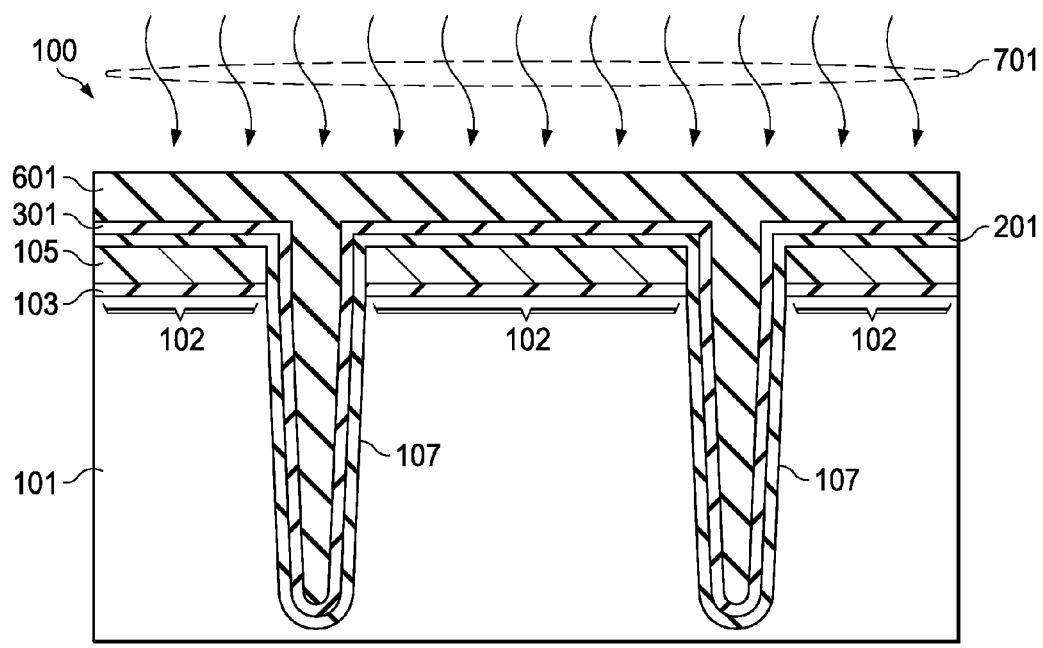
FIG. 7 illustrates an anneal performed on the dielectric material in accordance with an embodiment.

FIG. 7 illustrates a second annealing process 701 that may be used to densify the dielectric material 601. In an embodiment the second annealing process 701 may be a two step annealing process using a first wet anneal followed by a second dry anneal. The first wet anneal may be performed by annealing the dielectric material 601 at a temperature of between about 400° C. and about 800° C., such as about 600° C. for a time period of between about 30 minutes and about 6 hours, such as about 3 hours. Additionally, the wet anneal may be performed in an ambient environment of hydrogen and oxygen, wherein the ratio of hydrogen to oxygen may be between about 2:1 and about 4:3, such as about 3:2.

Once the wet anneal has been completed, a separate dry anneal may be performed on the dielectric material 601. In an embodiment the dielectric material 601 may be annealed at a temperature of between about 900° C. and about 1200° C., such as about 1100° C. for a time period of between about 15 minutes and about 120 minutes, such as about 30 minutes. Additionally, the dry anneal may be performed in a nitrogen ambient environment, although any other suitable annealing environment may alternatively be utilized.

However, as one of ordinary skill in the art will recognize, the two-step annealing process described above is only intended to be an illustrative embodiment of the annealing process 701, and is not intended to be limiting to the embodiments. Any suitable annealing process, such as a single dry anneal, may alternatively be utilized, and all such alternatives are fully intended to be included within the scope of the embodiments.

Figure 8:
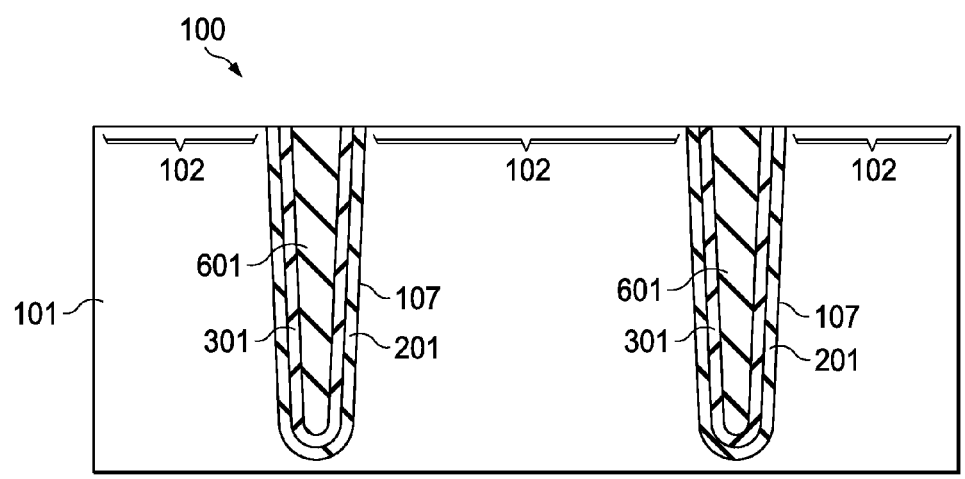
FIG. 8 illustrates a planarization of the dielectric material in accordance with an embodiment.

FIG. 8 illustrates the removal of excess dielectric material 601, second liner 301 and first liner 201 located outside of the trenches 107 to form isolation trenches 801. In an embodiment the excess dielectric material 601, second liner 301 and first liner 201 may be removed using, e.g., a chemical mechanical polishing (CMP) process in which etchants and abrasives are utilized to chemically and mechanically grind the excess dielectric material 601, second liner 301, and first liner 201 until the dielectric material 601, the second liner 301 and the first liner 201 are planar with the substrate 101. Additionally, as the CMP process is planarizing the dielectric material 601, second liner 301 and first liner 201 with the substrate 101, the buffer layer 103 and the masking layer 105 may also be removed from the surface of the substrate 101, thereby exposing the active areas 102 for further processing.

FIG. 9 illustrates the formation of a transistor 900 after the formation of the trenches 107 has been performed. The transistor may be used for any purpose, such as a pull-up transistor or pull-down transistor, and may comprise a gate dielectric 901, a gate electrode 903, spacers 905, and source/drain regions 907. The dielectric layer 901 may be a high-K dielectric material, such as silicon oxide, silicon oxynitride, silicon nitride, an oxide, a nitrogen-containing oxide, a combination thereof, or the like. In an embodiment the dielectric layer 901 may have a relative permittivity value greater than about 4. Other examples of such materials include aluminum oxide, lanthanum oxide, hafnium oxide, zirconium oxide, hafnium oxynitride, or combinations thereof.

In an embodiment in which the dielectric layer 901 comprises an oxide layer, the dielectric layer 901 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the dielectric layer 901 is between about 8 Å to about 200 Å in thickness.

The gate electrode 903 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In an embodiment in which the gate electrode 903 is poly-silicon, the gate electrode 903 may be formed by depositing doped or undoped poly-silicon by low-pressure chemical vapor deposition (LPCVD) to a thickness in the range of about 400 Å to about 2,500 Å, but more preferably about 1,500 Å.

The spacers 905 may be formed by blanket depositing a spacer layer (not shown) over the previously formed structure. The spacer layer may comprise SiN, oxynitride, SiC, SiON, oxide, combinations of these, and the like and may be formed by commonly used methods such as chemical vapor deposition (CVD), plasma enhanced CVD, sputter, and other methods known in the art. The spacers 905 are then patterned, such as by anisotropically etching and removing the spacer layer from the horizontal surfaces of the structure.

In an embodiment, the source/drain regions 907 may be formed by one or more implantations of impurities, such as arsenic or boron, into the substrate 101. The source/drain regions 907 may be formed such that the device is either an NMOS device or a PMOS device. Because the gate electrode 903 and spacers 905 are used as masks, the source/drain regions 907 are substantially aligned with the gate electrode 903 and the respective spacers 905.

It should be noted that, though the above-described process to form source/drain regions 907 describes a specific process, one of ordinary skill in the art will realize that many other processes, steps, or the like may be used. For example, one of ordinary skill in the art will realize that a plurality of implants may be performed using various combinations of spacers and liners to form source/drain regions 907 having a specific shape or characteristic suitable for a particular purpose. Any of these processes may be used to form the source/drain regions 907, and the above description is not meant to limit the present invention to the steps presented above.

FIG. 10 illustrates a process flow summary 1000 for an embodiment of the processes described above with respect to FIGS. 1-8. As shown the trenches 107 may be formed in the substrate 101 (Step 1001), the first liner 201 may be formed (Step 1003), and then the first liner 201 may be annealed (Step 1005). The second liner 301 may then be formed (Step 1007) and, after the second liner 301 has been formed, an outgassing step may be performed (Step 1009). The second liner 301 may then etched (Step 1011). Dielectric material 601 may then be used to cap the trenches 107 (Step 1013), the dielectric material 601 may be annealed (Step 1015), and the structure may be planarized utilizing, e.g., a CMP process (Step 1017).

FIG. 11 illustrates another embodiment in which the process flow illustrated in FIG. 10 may be simplified. In particular, instead of adding a new process step (see, e.g., Step 1009 in FIG. 10) for the second liner outgassing, the forming the second liner (Step 1007) is performed before the first liner anneal (Step 1005 in FIG. 10) and the first liner anneal is combined with the second liner outgassing into a single first liner anneal/second liner outgassing (Step 1101). In this fashion, the thermal anneal or other processing steps that comprise the first liner anneal may be utilized for both annealing the first liner and also for outgassing the second liner in the first liner anneal/second liner outgassing (Step 1101). By simplifying the process flow in this fashion, the thermal budget for the overall process may be reduced, and the overall process may be simplified without the need for an additional process step.

By removing the residual precursor materials from the second liner 301 prior to the introduction of the etchants in the etching process 501, at least one of the reactants that could form the gel like material may be removed. By removing the reactants that make the gel like material, the gel like material may be prevented even before it is formed. As such, the number of defects may be eliminated or reduced below the treatments several hundreds of thousands of defects that may occur using SPM or SPM with an oxygen ashing.

In accordance with an embodiment, a method for manufacturing a semiconductor device comprising forming a trench in a substrate and lining the trench with a first dielectric material is provided. An outgassing process is performed on the first dielectric material.

In accordance with another embodiment, a method for manufacturing a semiconductor device comprising forming a first liner in a trench in a substrate and halting the formation of the first liner is provided. The first liner is treated after the halting the formation of the first liner, the treating the first liner removing residual precursor material from the first liner. The first liner is etched, and the trench is filled with dielectric material.

In accordance with yet another embodiment, a method of manufacturing a semiconductor device comprising forming a trench in a substrate and forming a first liner in the substrate is provided. A second liner is formed over the first liner in the substrate, the forming the second liner utilizing a first precursor material and leaving a residual precursor material within the second liner. At least a portion of the residual precursor is removed from the first liner, and the first liner is etched utilizing a self-limiting etch process. The trench is filled with a dielectric material.

In accordance with yet another embodiment, a semiconductor device comprising an opening in a substrate is provided. A degassed first dielectric material lines the opening.

In accordance with yet another embodiment, a semiconductor device comprising a substrate with an opening extending into the substrate is provided. A first liner is lining the opening, the first liner having a precursor by-product vacant top surface, and a second dielectric material fills a remainder of the opening.

In accordance with yet another embodiment, a semiconductor device comprising a first liner within an opening of a substrate, the first liner comprising atoms of a first precursor material, is provided. A first dielectric material fills the opening on an opposite side of the first liner from the substrate, the first dielectric material comprising atoms of a second precursor material, wherein an interface between the first liner and the first dielectric material has an absence of a reaction product of the first precursor material and the second precursor material.

Although the present invention and its advantages have been described in detail, it should be understood that various changes, substitutions and alterations can be made herein without departing from the spirit and scope of the invention as defined by the appended claims. For example, the outgassing processes may be any process that reduces or lessens the amount of residual precursor chemicals, and is not strictly limited to those processes described above.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    forming an opening in a substrate;
    lining the opening with a first dielectric material;
    degassing the first dielectric material to form a degassed dielectric material; and
    performing a first self-limiting etch on the degassed dielectric material.

2. The method of claim 1, wherein the degassing the first dielectric material is performed at least in part by an annealing process.

3. The method of claim 1, wherein the degassing the first dielectric material is performed at least in part by a wet etch process.

4. The method of claim 3, wherein the degassing the first dielectric material is performed at least in part with $H_2SO_4$.

5. The method of claim 1, further comprising:
    stopping the first self-limiting etch on the degassed dielectric material; and
    performing a second self-limiting etch after the stopping the first self-limiting etch.

6. The method of claim 1, further comprising lining the opening with a second dielectric material prior to the lining the opening with the first dielectric material.

7. The method of claim 1, wherein the performing the first self-limiting etch further comprises:
    forming a layer from the degassed dielectric material; and
    thermally decomposing the layer to remove the layer from a remaining portion of the degassed dielectric material.

8. A method of manufacturing a semiconductor device, the method comprising:
    forming a high aspect ratio opening within a substrate;
    introducing a first precursor to form a first dielectric liner within the high aspect ratio opening;
    stopping the introducing the first precursor;
    degassing the first dielectric liner after the stopping the introducing the first precursor; and
    etching the first dielectric liner a first time, wherein the etching the first dielectric liner the first time is a first self-limiting etch.

9. The method of claim 8, wherein the degassing the first dielectric liner is performed at least in part by an annealing process.

10. The method of claim 8, wherein the degassing the first dielectric liner is performed at least in part by a wet etch process.

11. The method of claim 8, wherein the degassing the first dielectric liner is performed at least in part with $H_2SO_4$.

12. The method of claim 8, wherein the first precursor is TEOS and wherein the etching the first dielectric liner the first time uses hydrogen fluoride and ammonia.

13. The method of claim 8, further comprising:
    stopping the etching the first dielectric liner the first time; and
    etching the first dielectric liner a second time after the stopping the etching the first dielectric liner the first time, wherein the etching the first dielectric liner the second time is a second self-limiting etch.

14. The method of claim 8, further comprising forming a second dielectric liner within the high aspect ratio opening prior to the introducing the first precursor.

15. A method of manufacturing a semiconductor device, the method comprising:
    introducing a first gaseous precursor to an opening in a substrate;
    introducing a second gaseous precursor to the opening in the substrate, wherein the first gaseous precursor and the second gaseous precursor form a dielectric liner within the opening, the dielectric liner comprising residual first gaseous precursor;
    removing the first gaseous precursor and the second gaseous precursor from the substrate; and
    removing the residual first gaseous precursor from the dielectric liner.

16. The method of claim 15, further comprising etching the dielectric liner after the removing the residual first precursor.

17. The method of claim 16, wherein the etching the dielectric liner is a self-limiting etch.

18. The method of claim 17, wherein the etching the dielectric liner uses hydrogen fluoride and ammonia.

19. The method of claim 17, further comprising filling a remainder of the opening with a dielectric material after the etching the dielectric liner.

20. The method of claim 15, wherein the first gaseous precursor is TEOS.

* * * * *